(12) United States Patent
Isler et al.

(10) Patent No.: US 8,328,069 B2
(45) Date of Patent: Dec. 11, 2012

(54) DEVICE AND METHOD FOR SELECTIVE SOLDERING

(75) Inventors: Hans Isler, Widen (CH); Ernst Wandke, Geretsried (DE)

(73) Assignee: Linde Atkiengesellschaft (DE)

( * ) Notice: Subject to any disclaimer, the term of this patent is extended or adjusted under 35 U.S.C. 154(b) by 0 days.

(21) Appl. No.: 12/516,359

(22) PCT Filed: Dec. 4, 2007

(86) PCT No.: PCT/EP2007/010523
§ 371 (c)(1),
(2), (4) Date: Nov. 13, 2009

(87) PCT Pub. No.: WO2008/086842
PCT Pub. Date: Jul. 24, 2008

(65) Prior Publication Data
US 2010/0059575 A1    Mar. 11, 2010

(30) Foreign Application Priority Data

Jan. 18, 2007  (DE) .......................... 10 2007 002 777
Mar. 13, 2007  (EP) ..................................... 07005179

(51) Int. Cl.
*B23K 31/02*    (2006.01)
*B23K 37/00*    (2006.01)

(52) U.S. Cl. ............... 228/37; 228/33; 228/42; 228/219; 228/256; 228/260

(58) Field of Classification Search .................... 228/37, 228/42, 256, 260, 33, 219, 220
See application file for complete search history.

(56) References Cited

U.S. PATENT DOCUMENTS

| 5,240,169 | A  | * | 8/1993  | Gileta ........................ 228/180.1 |
| 5,860,582 | A  | * | 1/1999  | Sund .............................. 228/6.2 |
| 6,655,574 | B2 | * | 12/2003 | Schouten et al. ............... 228/37 |
| 6,705,506 | B1 | * | 3/2004  | Sund ............................... 228/42 |
| 6,732,903 | B2 | * | 5/2004  | Wang et al. ..................... 228/37 |
| 6,742,693 | B2 | * | 6/2004  | Wang et al. ..................... 228/37 |
| 2003/0080175 | A1 | * | 5/2003 | Toba .............................. 228/37 |
| 2007/0228103 | A1 | * | 10/2007 | Chuang et al. ................. 228/32 |

FOREIGN PATENT DOCUMENTS

| DE | 43 14 241 C2  | 4/1993 |
| DE | 202 20 971 U1 | 9/2004 |
| EP | 1 674 186 A1  | 6/2006 |
| NL | 1 013 640 C2  | 5/2001 |

* cited by examiner

*Primary Examiner* — Devang R Patel
(74) *Attorney, Agent, or Firm* — Joshua L. Cohen

(57) ABSTRACT

The invention relates to a device and method for selective soldering, including at least one nozzle and a soldering channel surrounded by a vertically moveable hood, which immerses in a soldering bath or which is sealed against a surface of the soldering bath. The hood includes a passage for each nozzle, at least one gas feeding device for providing protective and/or active gas underneath the hood, and flow plates which are attached to the hood to extend substantially downward in the direction of the soldering bath from the hood.

4 Claims, 2 Drawing Sheets

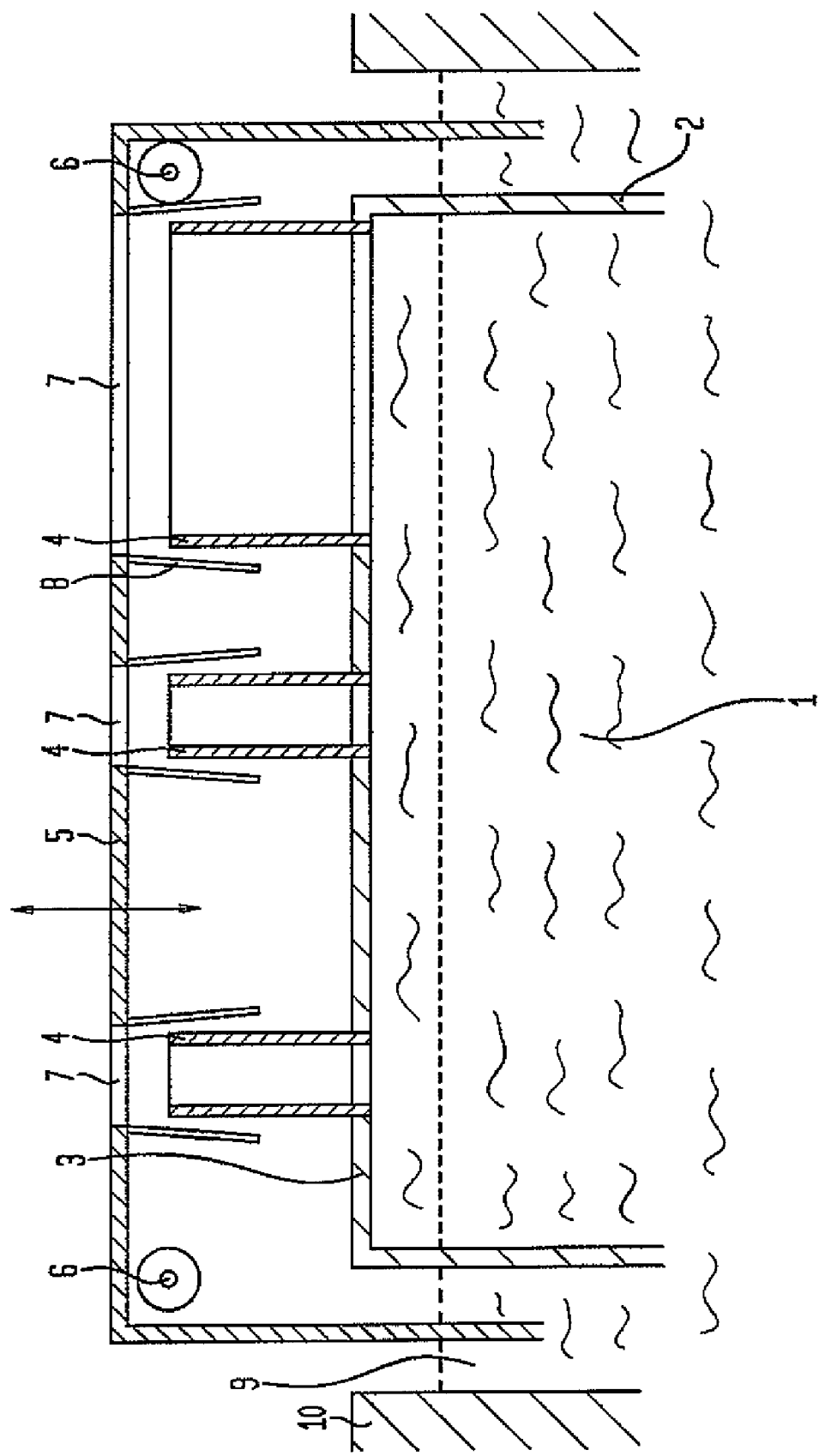

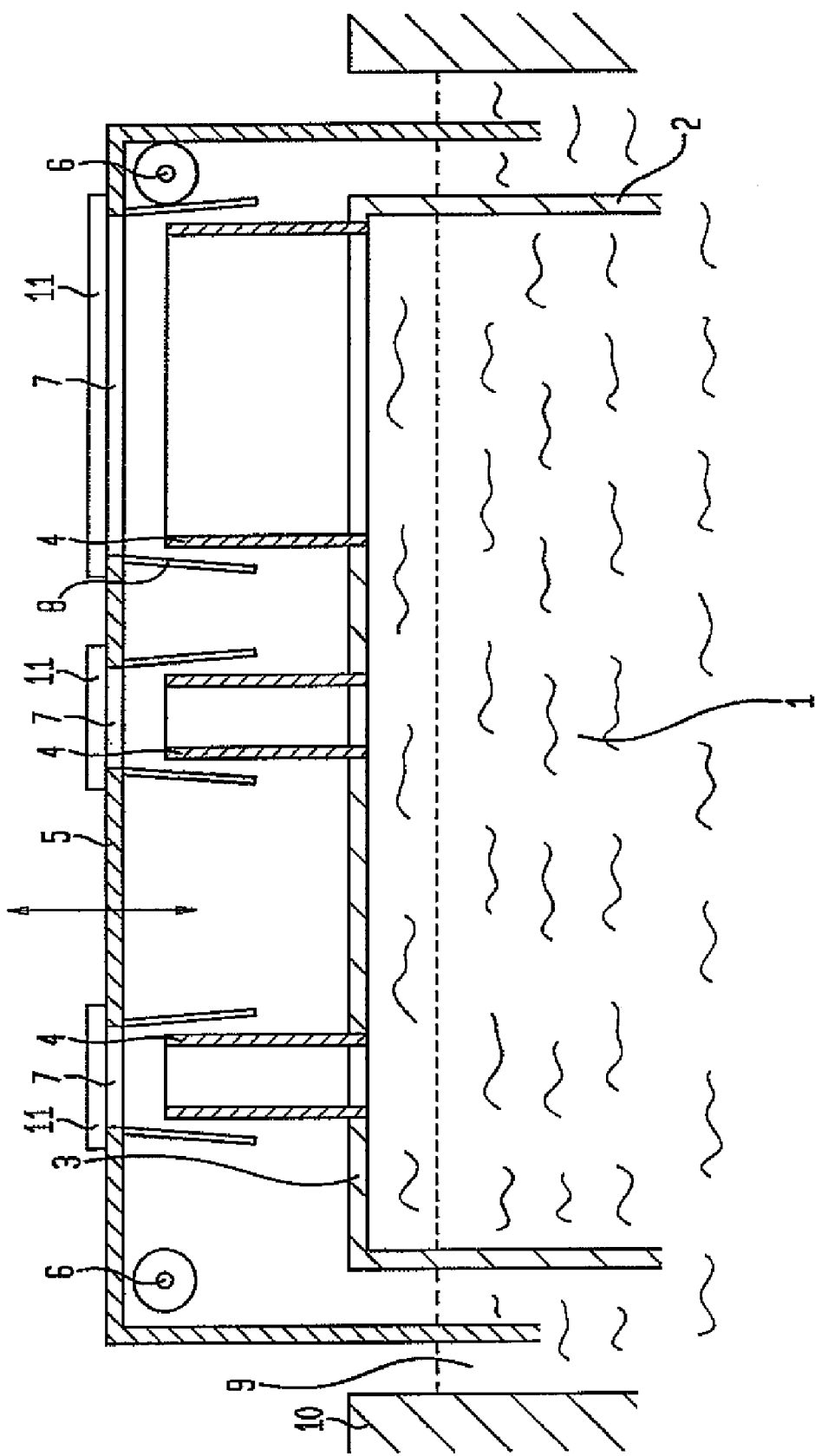

DEVICE AND METHOD FOR SELECTIVE SOLDERING

The instant invention relates to a device and method for selective soldering.

The selective soldering is a method which is well-established for soldering electronics assembly components. It has proven to be advantageous especially for large and heavy components, such as transformers, plugs, electrolytic capacitors and others, which can be subjected to high mechanical stresses, e.g. Preferably, such components are soldered according to the so-called push-through technique in the selective soldering method. The selective soldering method can be described as a localized soldering method, where the liquid solder is, for the most part, supplied to the soldering locations via vertical nozzles. For this purpose, a mini soldering wave can also be generated at the upper end of the nozzles. DE 43 14 241 C2 discloses a device for selective soldering with the afore-described characteristics.

The exposure of solder at the upper ends of the nozzles, mainly during the breaks between two soldering processes, that is, in stand-by mode of a selective soldering machine, must be considered to be disadvantageous in the state of the art. Likewise, the relatively small inerting during the soldering process and a related increased formation of waste metal as well as an increased error rate are to be mentioned as disadvantages.

DE 202 20 971 U1 discloses a method for selective soldering, where the protection of the solder against oxidation is considerably improved with the use of a movable hood.

It is the object of the instant invention to provide a device and a method for selective soldering.

With reference to the device, the assigned object is solved in that the soldering channel is surrounded by a vertically moveable hood, which immerses in the soldering bath or which is sealed against the surface of the soldering bath in another manner and which comprises a passage for each nozzle and in that provision is made underneath the hood for at least one feeding device for protective and/or active gas, wherein flow plates (8), which extend substantially downward in the direction of the soldering bath from the hood, are attached to the hood (5).

The device according to the invention has one or a plurality of nozzles, which are mounted on the soldering channel.

The use of protective and/or active gas is particularly important for a problem-free operation of the device, due to the small dimensions and due to the limited solder quantity, which is used. Typically, an inert protective gas will be advantageous. In special cases, an active gas can provide a particular advantage. Only the term protective gas or protective gas atmosphere will be used hereinbelow, wherein this term is to always also include an active gas or an active gas atmosphere.

The hood according to the invention makes it possible for the upper ends of the nozzles to be enveloped in the protective gas atmosphere, whereby it is possible to lower the degree of contamination of the soldering locations and the error rates in response to the soldering to an advantageous degree.

It constitutes a particular advantage that the hood as a protective gas covering is arranged so as to be displaceable in vertical direction and that the nozzles are thus completely enveloped by the protective gas atmosphere in stand-by mode, thus between two soldering processes, and that only the uppermost part of the nozzle for the direct contact to the components, which are to be soldered, is released during the soldering process and that the protective gas thus flows around said uppermost part of the nozzle in a virtually ideal manner.

The inerting effect of the protective gas will be further improved by means of the flow plates, which are attached to the hood. A particularly advantageous possibility for attaching the flow plates is on the hood and is oriented downward in the direction of the soldering bath.

The feeding devices for protective gas can advantageously be embodied as gas lances.

Preferably, the upper end of the nozzle is embodied as a soldering head for forming a soldering wave.

Particularly advantageously, the upper closure of the soldering channel is embodied as a cover sheet. The cover sheet tightly seals with the soldering channel and is penetrated by the nozzles and fixes them.

According to an advantageous development of the invention, provision is made in the hood for additional sheets for covering the passages. The total of the required protective gas quantity can be successfully reduced further by means of these additional sheets.

With reference to the method, the assigned object is solved by means of a method, which encompasses the following steps:

1) a printed circuit board, which is to be soldered and which is prepared for being soldered, is transported into a soldering area,
2) the printed circuit board and the hood are either lowered together at the same time and/or the printed circuit board is positioned on a previously lowered hood,
3) the soldering process is then carried out, wherein solder is pumped from a soldering channel upward to the soldering location via the at least one nozzle and wherein protective and/or active gas is fed during the soldering process via a feeding device and
4) the printed circuit board leaves the soldering area after the soldering process has ended and the housing of the soldering area is lifted again by lifting the hood and
5) the passages (7) are covered during two soldering processes with additional sheets (11), which are assigned to the individual passages.

The term of the prepared printed circuit board specifies herein in particular an equipped, fluxed and generally preheated printed circuit board.

Due to the fact that the passages in the hood are covered by means of additional sheets between two soldering processes, the required quantity of protective gas can be further reduced in the so-called stand-by mode and the inerting effect can be improved. Advantageously, the additional sheets are removed at the onset of a soldering process by means of the lowering motion of the hood so that the passages 7 are open during the soldering process. The additional sheets are again positioned above the passages and they are thus closed therewith only with the upward motion of the hood after a soldering process has ended.

Particularly advantageously, a first quantity per time unit of protective and/or active gas is fed during the soldering process and a second quantity per time unit of protective and/or active gas is fed between two soldering processes.

Particularly preferred, the quantity of the protective and/or active gas, which is fed by means of the feeding device, after the soldering process has ended, is reduced as compared to the quantity, which is fed during the soldering process.

Prior to the onset of the soldering process, the hood is advantageously lowered to a level, which is matched to the component geometry of the printed circuit board on the underside and which lies slightly below the lowermost point of the component assembly, which is to be soldered.

The instant invention provides for a number of advantages. Several of these advantages will be mentioned below: The efficiency of using the protective gas, which is used, is improved, the soldering quality is increased, the waste metal formation is reduced and the maintenance effort and the operating costs can be lowered by means of the instant invention.

The invention as well as further embodiments of the invention will be specified in more detail below by means of the exemplary embodiments illustrated in the figures.

FIG. 1 shows a device for selective soldering according to the invention,

FIG. 2 shows a development of a device according to the invention comprising additional sheets for covering.

In detail, FIG. 1 shows a container 10 for liquid solder, which contains a so-called soldering bath 9, with a soldering channel 2. The figure furthermore illustrates three nozzles 4, which are mounted on the soldering channel 2. In this example and generally, the soldering channel 2 is embodied as a pressure channel and is to be viewed as being closed toward the environment. The soldering channel 2 is illustrated only partially in FIG. 2.

The nozzles 4 are mounted on the soldering channel 2 in the area of the cover sheet 3 and are fixed by said soldering channel 2. To pressurize the liquid solder 1, provision is made for a soldering pump (not illustrated). The soldering channel 2 is surrounded by a vertically movable hood 5, which immerses in the soldering bath 9 and which is sealed against the surface of the soldering bath 9 in such a manner. Provision is made in the hood 5 for a passage 7 for each nozzle 4. Furthermore, provision is made in this example for two feeding devices 6 for protective gas, which serve the purpose of feeding protective gas underneath the hood 5.

Nitrogen, for example, as inerting protective gas, is blown in via the feeding devices 6. The feeding devices 6 are thereby embodied as gas lances 6 in this example.

In an exemplary embodiment of the method according to the invention, a printed circuit board, which is prepared for the selective soldering, is transported into the soldering area after it has passed the common functional units, such as fluxer and preheating area. Immediately prior to the arrival of the printed circuit board in the soldering area, the hood 5 is lowered in vertical direction to the extent as is required for an undisturbed selective soldering process as a function of the component geometry on the underside. For example, a lowering to a level, which lies 1 to 2 mm below the lowest point of the component, which is to be soldered, is carried out. It is thus possible to save protective gas and to reduce the formation of waste metal during the soldering process. The printed circuit board is positioned on the lowered hood 5. The soldering process is then carried out.

After the soldering process has ended, the hood 5 is again moved upward into the initial position. Particularly advantageously, the introduction of gas is then carried out only with a quantity of protective gas, which is reduced as compared to the soldering process. This mode can also be identified as stand-by mode. By feeding protective gas underneath the hood 5 in stand-by mode, protective gas continues to flow around the nozzles in an optimal manner, whereby the waste metal production at the upper ends of the nozzles is minimized.

FIG. 2 shows additional sheets 11, which temporarily cover the passages 7. A particular advantage results when the passages 7 in the hood 5 are closed by means of the additional sheets 11 in stand-by mode, because the required quantity of protective gas can thus be further reduced and the inerting effect can be improved. Advantageously, the additional sheets 11 are removed with the lowering motion of the hood 5 at the onset of a soldering process so that the passages 7 are open during the soldering process. The additional sheets 11 are again positioned above the passages only with the upward motion of the hood 5 after a soldering process has ended and said sheets 11 are closed therewith.

The inerting effect of the protective gas can be further improved by means of the flow sheets 8 shown in FIG. 1 and in FIG. 2. In the instant exemplary embodiments, each flow sheet 8 is formed as a cone.

The invention claimed is:

1. A device for selective soldering, comprising a container for liquid solder which contains a soldering bath, a soldering channel, at least one nozzle mounted on the soldering channel, a hood surrounding the soldering channel and which is vertically moveable to be immerseable in the soldering bath and seal against a surface of the soldering bath, the hood comprising a passage for the at least one nozzle, a space underneath the hood in which at least one gas feeding device is disposed for providing at least one of protective and active gas to the space, flow sheets attached to the hood which extend substantially downward from the hood in a direction toward the soldering bath and which move with the hood, and an additional sheet constructed and arranged to temporarily cover the passage in a stand-by mode.

2. The device according to claim 1, wherein an upper end of the at least one nozzle comprises a soldering head for forming a soldering wave.

3. The device according to claim 1, wherein an upper end of the soldering channel comprises a cover sheet.

4. The device according to claim 1, wherein the flow sheets comprise a conical shape.

* * * * *